(12) United States Patent
Kitagaito et al.

(10) Patent No.: US 12,062,522 B2
(45) Date of Patent: Aug. 13, 2024

(54) PLASMA ETCHING METHOD AND PLASMA ETCHING APPARATUS

(71) Applicant: Tokyo Electron Limited, Tokyo (JP)

(72) Inventors: Keiji Kitagaito, Miyagi (JP); Fumiya Kobayashi, Miyagi (JP); Maju Tomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 286 days.

(21) Appl. No.: 17/662,249

(22) Filed: May 6, 2022

(65) Prior Publication Data
US 2022/0262646 A1 Aug. 18, 2022

Related U.S. Application Data

(60) Division of application No. 16/887,023, filed on May 29, 2020, now Pat. No. 11,355,352, which is a
(Continued)

(30) Foreign Application Priority Data

May 15, 2013 (JP) ................. 2013-102969

(51) Int. Cl.
*H01J 37/32* (2006.01)
*C23C 16/04* (2006.01)
(Continued)

(52) U.S. Cl.
CPC ...... *H01J 37/32091* (2013.01); *C23C 16/045* (2013.01); *C23C 16/402* (2013.01);
(Continued)

(58) Field of Classification Search
CPC .......... H01J 37/32091; H01J 37/32165; H01J 37/32183; H01J 37/32366;
(Continued)

(56) References Cited

U.S. PATENT DOCUMENTS 7,078,339 B2   7/2006 Lee
7,517,804 B2   4/2009 Kiehlbauch et al.
(Continued)

FOREIGN PATENT DOCUMENTS

JP   2008-060566   3/2008
JP   2009-076661   4/2009
(Continued)

OTHER PUBLICATIONS

Kim, J.K., et al. "Study on the etching characteristics of amorphous carbon layer in oxygen plasma with carbonyl sulfide", Journal of Vacuum Science and Technology A, U.S., American Vacuum Society, Mar. 31, 2013, vol. 31, No. 2, pp. 021301-1-021301-7.

*Primary Examiner* — Kurt Sweely
(74) *Attorney, Agent, or Firm* — IPUSA, PLLC

(57) ABSTRACT

A plasma etching method for plasma-etching an object including an etching target film and a patterned mask. The plasma etching method includes a first step of plasma-etching the etching target film using the mask, and a second step of depositing a silicon-containing film using plasma of a silicon-containing gas on at least a part of a side wall of the etching target film etched by the first step.

12 Claims, 13 Drawing Sheets

Related U.S. Application Data continuation of application No. 16/194,848, filed on Nov. 19, 2018, now Pat. No. 10,707,091, which is a continuation of application No. 14/889,191, filed as application No. PCT/JP2014/062470 on May 9, 2014, now Pat. No. 10,163,653.

(51) Int. Cl.
| | | |
|---|---|---|
| *C23C 16/40* | (2006.01) | |
| *C23C 16/455* | (2006.01) | |
| *C23C 16/509* | (2006.01) | |
| *H01L 21/28* | (2006.01) | |
| *H01L 21/3065* | (2006.01) | |
| *H01L 21/311* | (2006.01) | |
| *H01L 21/3213* | (2006.01) | |
| *H01L 21/67* | (2006.01) | |

(52) U.S. Cl.
CPC ...... *C23C 16/509* (2013.01); *H01J 37/32394* (2013.01); *H01J 37/3244* (2013.01); *H01J 37/32532* (2013.01); *H01J 37/32715* (2013.01); *H01L 21/28238* (2013.01); *H01L 21/3065* (2013.01); *H01L 21/31105* (2013.01); *H01L 21/31116* (2013.01); *H01L 21/31122* (2013.01); *H01L 21/31138* (2013.01); *H01L 21/31144* (2013.01); *H01L 21/32136* (2013.01); *H01L 21/67069* (2013.01); *C23C 16/45565* (2013.01); *H01J 37/32165* (2013.01); *H01J 37/32183* (2013.01); *H01J 37/32366* (2013.01); *H01J 2237/334* (2013.01)

(58) Field of Classification Search
CPC ........... H01J 37/32394; H01J 37/32403; H01J 37/3244; H01J 37/32532; H01J 37/32715; H01J 2237/334; H01L 21/28238; H01L 21/3065; H01L 21/31105; H01L 21/31116; H01L 21/31122; H01L 21/31138; H01L 21/31144; H01L 21/32136; H01L 21/67069; H01L 21/68714; C23C 16/04; C23C 16/042; C23C 16/045; C23C 16/047; C23C 16/24; C23C 16/325; C23C 16/345; C23C 16/401; C23C 16/402; C23C 16/42; C23C 16/45565; C23C 16/4584; C23C 16/509; C23C 16/5093

See application file for complete search history.

(56) References Cited

U.S. PATENT DOCUMENTS

| | | | | |
|---|---|---|---|---|
| 8,088,691 | B2* | 1/2012 | Kiehlbauch | H01L 21/31116 438/723 |
| 8,153,520 | B1* | 4/2012 | Chandrashekar | H01L 21/7684 438/457 |
| 8,241,514 | B2* | 8/2012 | Honda | H01L 21/67069 438/714 |
| 10,163,653 | B2* | 12/2018 | Kitagaito | H01L 21/28238 |
| 10,707,091 | B2* | 7/2020 | Kitagaito | H01L 21/3065 |
| 11,355,352 | B2* | 6/2022 | Kitagaito | H01J 37/32532 |
| 2004/0002217 | A1 | 1/2004 | Mazur et al. | |
| 2005/0103748 | A1 | 5/2005 | Yamaguchi et al. | |
| 2006/0180571 | A1 | 8/2006 | Fujihara et al. | |
| 2007/0026677 | A1 | 2/2007 | Ji et al. | |
| 2010/0297849 | A1 | 11/2010 | Miyake et al. | |
| 2011/0021029 | A1* | 1/2011 | Kamp | H01L 21/76816 438/710 |
| 2011/0079918 | A1* | 4/2011 | Zhou | G03F 7/427 257/E23.145 |
| 2012/0214313 | A1 | 8/2012 | Ooya et al. | |
| 2012/0225502 | A1 | 9/2012 | Nakagawa | |
| 2012/0244709 | A1 | 9/2012 | Garashi et al. | |
| 2014/0134846 | A1 | 5/2014 | Hirayama et al. | |

FOREIGN PATENT DOCUMENTS

| | | |
|---|---|---|
| JP | 2011-204999 | 10/2011 |
| JP | 2012-204668 | 10/2012 |
| TW | 201316408 | 4/2013 |

* cited by examiner

PLASMA ETCHING METHOD AND PLASMA ETCHING APPARATUS

CROSS-REFERENCE TO RELATED APPLICATIONS

The present application is a divisional of U.S. patent application Ser. No. 16/887,023 filed on May 29, 2020, which is a continuation of U.S. patent application Ser. No. 16/194,848 filed on Nov. 19, 2018, which is a continuation of U.S. patent application Ser. No. 14/889,191 filed on Nov. 5, 2015, which is the National Stage of PCT International Application No. PCT/JP2014/062470 filed on May 9, 2014, which is based on and claims priority to Japanese Patent Application No. 2013-102969 filed on May 15, 2013. The entire contents of these applications are incorporated herein by reference.

TECHNICAL FIELD

The present invention relates to a plasma etching method and a plasma etching apparatus.

BACKGROUND ART

Due to the high-density integration of semiconductor devices in recent years, wiring and separation widths of circuit patterns required for producing semiconductor devices have become smaller. Typically, a circuit pattern is formed by etching a target film using a patterned mask.

To form a fine circuit pattern, it is necessary to reduce the minimum size of a mask pattern and to accurately transfer openings with small sizes to a target film.

However, when etching an organic mask made of, for example, an amorphous carbon layer film (which is hereafter referred to as an "ACL film"), "bowing", where the cross section of a part of an opening of the ACL film widens, may occur. When bowing occurs, the ACL film being etched collapses and the opening is closed. This, for example, may result in a problem where a target film becomes unable to be etched.

Patent Document 1 discloses a technology for suppressing bowing by using an oxygen gas ($O_2$) and a carbonyl sulfide (COS) gas as process gases.

RELATED-ART DOCUMENT

Patent Document

[Patent Document 1] Japanese Laid-Open Patent Publication No. 2011-204999

DISCLOSURE OF INVENTION

Problems to be Solved by the Invention

However, although the technology disclosed by Patent Document 1 can reduce bowing, it still cannot solve the problem described above.

An aspect of this disclosure provides a plasma etching method that can solve the above problem and can form a desired shape by etching.

Means for Solving the Problems

In an aspect of this disclosure, there is provided a plasma etching method for plasma-etching an object including an etching target film and a patterned mask. The plasma etching method includes a first step of plasma-etching the etching target film using the mask, and a second step of depositing a silicon-containing film using plasma of a silicon-containing gas on at least a part of a side wall of the etching target film etched by the first step.

Advantageous Effect of the Invention

An aspect of this disclosure makes it possible to provide a plasma etching method that can form a desired shape by etching.

DESCRIPTION OF EMBODIMENTS

Embodiments of the present invention are described below with reference to the accompanying drawings. Throughout the specification and the drawings, the same reference number is assigned to substantially the same components, and repeated descriptions of those components are omitted.

<Plasma Etching Apparatus>

An overall configuration of a plasma etching apparatus that can perform a plasma etching method of an embodiment is described. An exemplary plasma etching apparatus used for descriptions in the present application is a parallel-plate type plasma etching apparatus where an upper electrode and a lower electrode (susceptor) are disposed in a chamber to face each other and a process gas is supplied through the upper electrode into the chamber.

Figure 1:
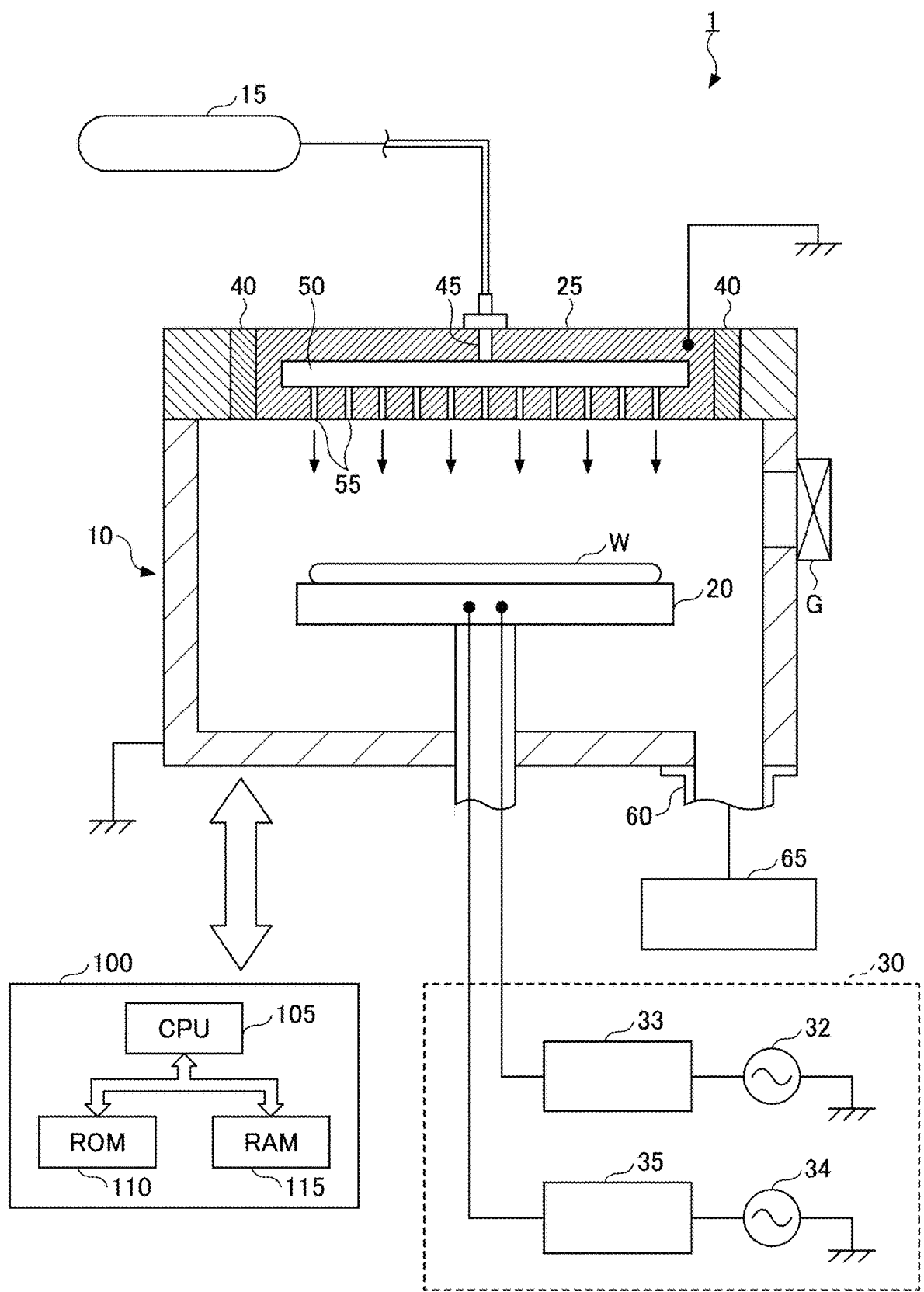
FIG. 1 is a schematic diagram illustrating an exemplary configuration of a plasma etching apparatus according to an embodiment.

FIG. 1 is a schematic diagram illustrating an exemplary configuration of a plasma etching apparatus according to an embodiment.

A plasma etching apparatus 1 includes a chamber 10 comprised of a conductive material such as aluminum and a gas supply 15 for supplying a process gas into the chamber 10. An appropriate process gas is selected according to the type of a mask, the type of a target film (a film to be etched), and so on.

The chamber 10 is electrically grounded. A lower electrode 20 and an upper electrode 25 are provided in the chamber 10. The upper electrode 25 is disposed in parallel with and to face the lower electrode 20.

The lower electrode 20 also functions as a mount table for holding an object to be processed, i.e., a semiconductor wafer W (hereafter referred to as a "wafer W") on which a single-layer film or a multi-layer film is formed.

A power supply device 30 for supplying dual-frequency superposed power is connected to the lower electrode 20. The power supply device 30 includes a first high-frequency power supply 32 for supplying first high-frequency power (plasma generation high-frequency power) with a first frequency, and a second high-frequency power supply 34 for supplying second high-frequency power (bias voltage generation high-frequency power) with a second frequency that is lower than the first frequency. The first high-frequency power supply 32 is electrically connected via a first matching box 33 to the lower electrode 20. The second high-frequency power supply 34 is electrically connected via a second matching box 35 to the lower electrode 20.

Each of the first matching box 33 and the second matching box 35 makes the internal (or output) impedance of the corresponding one of the first high-frequency power supply 32 and the second high-frequency power supply 34 to match a load impedance. While plasma is being generated in the chamber 10, each of the first matching box 33 and the second matching box 35 makes the internal impedance of the corresponding one of the first high-frequency power supply 32 and the second high-frequency power supply 34 to apparently match the load impedance.

The upper electrode 25 is attached to a ceiling of the chamber 10 via a shield ring 40 covering the periphery of the upper electrode 25. The upper electrode 25 may be electrically grounded as illustrated in FIG. 1. Alternatively, a variable direct-current power supply (not shown) may be connected to the upper electrode 25 so that a direct-current (DC) voltage is applied to the upper electrode 25.

A gas inlet 45 for introducing a gas from the gas supply 15 is formed in the upper electrode 25. Also, a diffusion chamber 50 is formed in the upper electrode 25 to diffuse a gas introduced via the gas inlet 45. Further, multiple gas supply holes 55 for supplying a gas from the diffusion chamber 50 into the chamber 10 are formed in the upper electrode 25. Through the gas supply holes 55, a process gas is supplied between the wafer W placed on the lower electrode 20 and the upper electrode 25. That is, a process gas from the gas supply 15 is first supplied via the gas inlet 45 into the diffusion chamber 50. Then, the process gas in the diffusion chamber 50 is distributed to the gas supply holes 55, and is ejected from the gas supply holes 55 toward the lower electrode 20. With the above configuration, the upper electrode 25 also functions as a gas showerhead for supplying a gas.

An evacuation port 60 is formed in the bottom of the chamber 10. An evacuation device 65 connected to the evacuation port 60 evacuates the chamber 10 and maintains the chamber 10 at a predetermined vacuum pressure.

A gate valve G is provided on a side wall of the chamber 10. The gate valve G opens and closes a port for carrying the wafer W into and out of the chamber 10.

The plasma etching apparatus 1 also includes a controller 100 for controlling operations of the entire plasma etching apparatus 1. The controller 100 includes a central processing unit (CPU) 105, and storage areas including a read-only memory (ROM) 110 and a random access memory (RAM) 115.

The CPU 105 performs a plasma etching process according to various recipes stored in the storage areas. A recipe includes control information for controlling the plasma etching apparatus 1 to perform a process according to process conditions. For example, the control information includes a process time, a pressure (gas discharge), high-frequency power and voltage, flow rates of various process gases, and inner-chamber temperatures (e.g., an upper electrode temperature, a chamber side-wall temperature, and an ESC temperature). Recipes indicating programs and process conditions may be stored in a hard disk or a semiconductor memory, or may be stored in a portable, computer-readable storage medium such as a CD-ROM or a DVD that is mounted on a predetermined position of a storage area.

A plasma etching method described later is performed by the exemplary plasma etching apparatus 1 of the present embodiment described above. In this case, the gate valve G is first opened, and the wafer W on which a target film is formed is carried into the chamber 10 and placed on the lower electrode 20 by, for example, a conveying arm (not shown). Next, the controller 100 controls components of the plasma etching apparatus 1 to generate desired plasma. Desired plasma etching is performed by the generate plasma according to a plasma etching method described later. An overall configuration of the plasma etching apparatus 1 of the present embodiment is described above.

<Plasma Etching Method>

Figure 2:
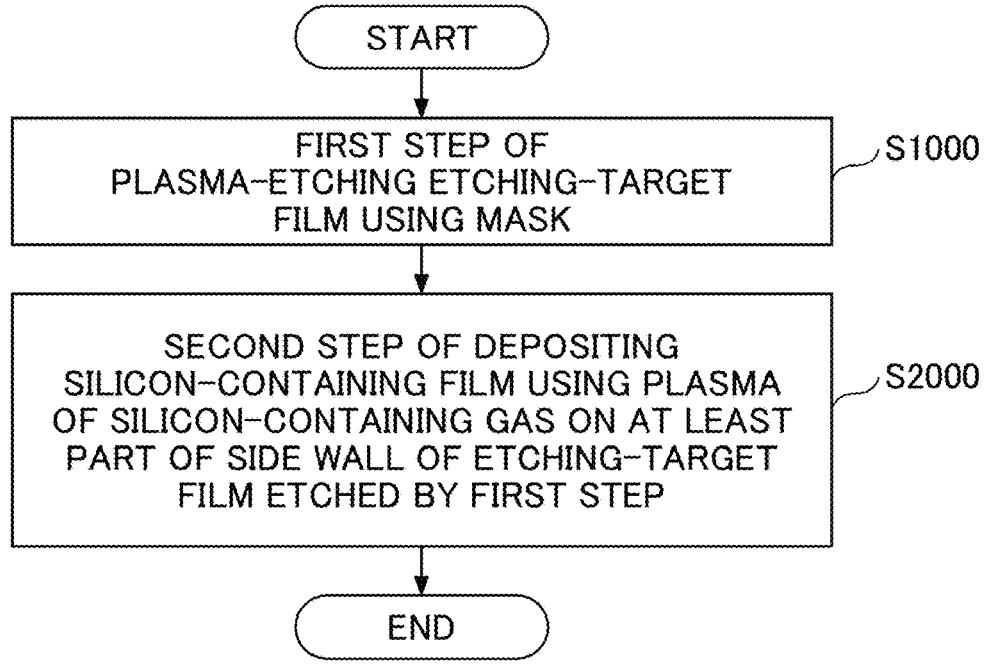
FIG. 2 is a flowchart illustrating an exemplary plasma etching method according to an embodiment.

FIG. 2 is a flowchart illustrating an exemplary plasma etching method according to the present embodiment.

The plasma etching method of the present embodiment performs plasma etching on an object including an etching-target film and a patterned mask. As illustrated by FIG. 2, the plasma etching method includes a first step (S1000) of plasma-etching the etching-target film using the mask, and a second step (S2000) of depositing a silicon-containing film using plasma of a silicon-containing gas on at least a part of a side wall of the etching-target film etched by the first step.

These steps are described in more detail with reference to FIGS. 3A through 3E.

FIGS. 3A through 3E are drawings used to describe an exemplary plasma etching method of the present embodiment.

In the example of FIGS. 3A through 3E, a plasma etching process is performed on a semiconductor wafer W including a silicon substrate 150, and an oxide film 155, an ACL film 160, a silicon oxynitride film (SiON film) 165, an antireflection film 170 (BARC film 170), and a photoresist film 175 that are stacked in this order on a surface of the silicon substrate 150. The layer structure of the semiconductor wafer W is briefly described below.

The silicon substrate 150 is a discoidal thin plate comprised of silicon. The oxide film ($SiO_2$ film) 155 is formed on a surface of the silicon substrate 150 by, for example, performing a thermal oxidation process on the surface. On the oxide film 155, the ACL film 160 is formed. The ACL film 160 is a mask layer and functions as a lower-layer resist film. On the ACL film 160, the SiON film 165 is formed by, for example, a CVD process or a PVD process. On the SiON film 165, the BARC film 170 is formed by, for example, an application process. Further, the photoresist film 175 is formed on the BARC film 170 by using, for example, a spin coater. The BARC film 170 includes a polymer resin including a pigment that absorbs light with a specific wavelength such as an ArF excimer laser beam emitted toward the photoresist film 175. The BARC film 170 prevents the ArF excimer laser beam, which passes through the photoresist film 175, from being reflected by the SiON film 165 or the ACL film 160 and reaching the photoresist film 175 again. The photoresist film 175 includes, for example, a positive photosensitive resin and is altered to have alkali solubility when illuminated by the ArF excimer laser beam.

Figure 3A:
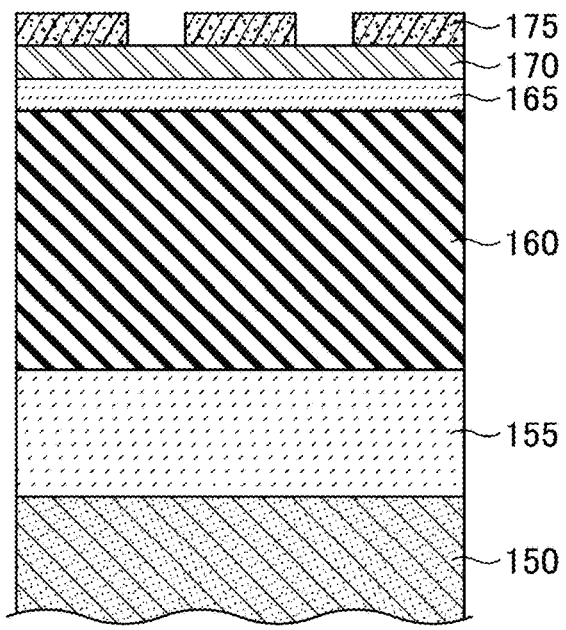
FIG. 3A is a drawing used to describe an exemplary plasma etching method of an embodiment.

With the semiconductor wafer W configured as described above, the photoresist film 175 is first patterned as illustrated by FIG. 3A. The photoresist film 175 may be patterned using a known photolithography technology.

Figure 3B:
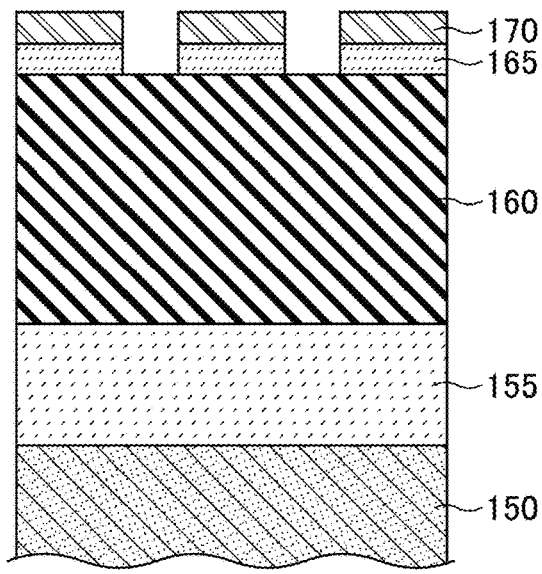
FIG. 3B is a drawing used to describe an exemplary plasma etching method of an embodiment.

Next, as illustrated by FIG. 3B, the BARC film 170 and the SiON film 165 are etched by plasma etching using the patterned photoresist film 175 as a mask.

Any process gas may be used to etch the BARC film 170 and the SiON film 165. To etch the BARC film 170 and the SiON film 165 at a high aspect ratio and a high etching rate, however, a mixed gas of a fluorocarbon (CF) gas such as carbon tetrafluoride ($CF_4$) and an oxygen ($O_2$) gas is preferably used.

Figure 3C:
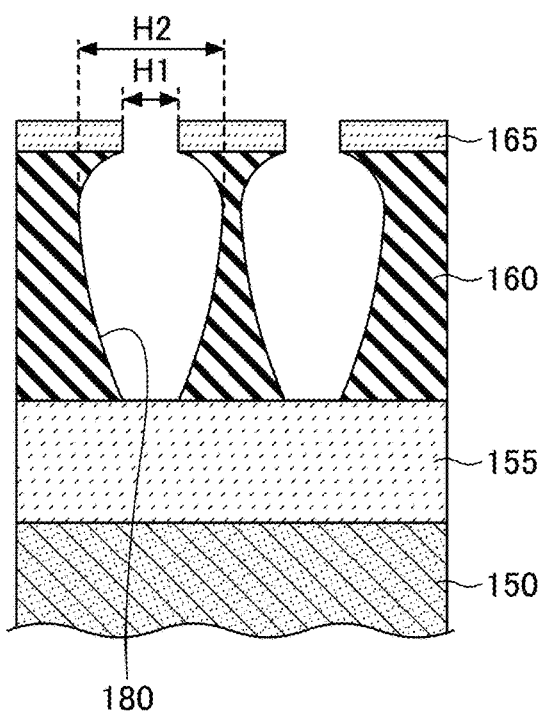
FIG. 3C is a drawing used to describe an exemplary plasma etching method of an embodiment.

Next, as illustrated by FIG. 3C, the ACL film 160 is etched by plasma etching using the SiON film 165 as a mask (S1000).

Although any process gas may be used for etching, to prevent bowing and form an opening (hole or trench) with a desired shape, a mixed gas of an oxygen gas ($O_2$) and a carbonyl sulfide (COS) gas is preferably used.

One problem that may occur in etching the ACL film 160 is "bowing" where a cross section of an opening of the ACL film 160 in a direction perpendicular to the thickness direction of the ACL film 160 becomes wider than a cross section of an opening of the SiON film 165. For example, as illustrated by FIG. 3C, a width H2 of an opening of the ACL film 160 (in FIG. 3C, H2 indicates the width of the widest part of the opening) becomes greater than a width H1 of an opening of the SiON film 165.

A cause of bowing is briefly described below. In etching, a process gas is converted by high-frequency power into plasma and ions (and radicals) are generated, and the ions bombard an object to be etched. The ions are incident on the object mainly in a vertically downward direction in FIGS. 3A through 3E. However, due to, for example, ion scattering caused by collision of molecules in the plasma, the ions are incident on the object at an incident angle with respect to the vertically downward direction. As a result, the ions bombard a side wall 180 of the ACL film 160 and cause bowing. Generally, as illustrated in FIG. 3C, when bowing occurs, the cross section of a part of the opening of the ACL film 160 closer to the SiON film 165 used as a mask becomes larger.

In other words, the cross section of a top part of the opening of the ACL film 160 tends to become larger than the cross section of a bottom part of the opening.

To satisfy the recent demand for downsizing semiconductor devices, it is preferably to prevent the occurrence of even slight bowing. When bowing occurs, the width of a partition wall between adjacent openings of the ACL film 160 becomes insufficient, and a problem such as a mask break, where the ACL film 160 is broken, occurs.

Figure 3D:
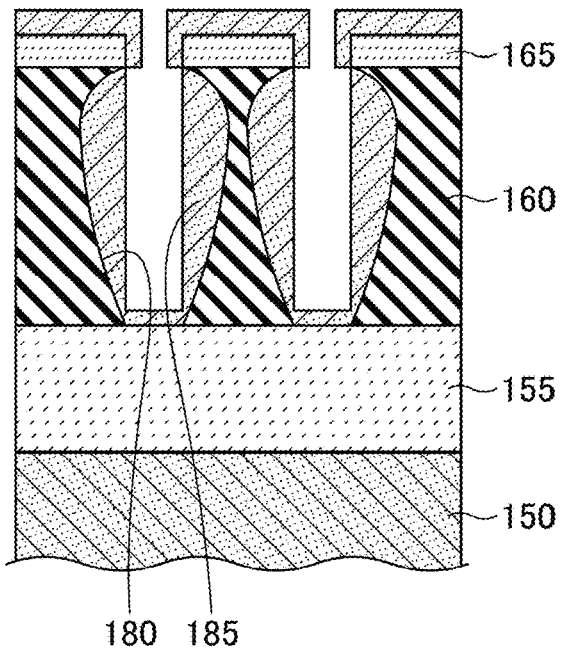
FIG. 3D is a drawing used to describe an exemplary plasma etching method of an embodiment.

For this reason, in the present embodiment, as illustrated by FIG. 3D, a silicon-containing film 185 is deposited using plasma of a silicon-containing gas on at least a part of the side wall 180 of at least an etching-target film (the ACL film 160 in the example of FIGS. 3A through 3E) at the second step (S2000).

Any silicon-containing gas may be used as long as a silicon-containing film can be deposited on at least a part of the side wall 180 of an etching-target film (the ACL film 160 in the example of FIGS. 3A through 3E) by plasma CVD (chemical vapor deposition) using the silicon-containing gas. In the present embodiment, as an example, a mixed gas of a silicon-containing gas such as silicon tetrachloride ($SiCl_4$) or silicon tetrafluoride ($SiF_4$), a reducing gas such as hydrogen ($H_2$), nitrogen ($N_2$), and a diluent gas including an inactive gas such as a noble gas (e.g., helium (He)) is used. With the mixed gas, the silicon-containing film 185 including silicon, silicon oxide (e.g., SiO, $SiO_2$), and/or silicon nitride (e.g., $Si_3N_4$) is deposited on the side wall 180 of the ACL film 160.

In the second step, a process gas including a silicon-containing gas is converted by high-frequency power into plasma, and generated ions and radicals are left as a deposit. As described above, due to, for example, ion scattering caused by collision of molecules in plasma, ions are incident on an object at an incident angle with respect to the vertically downward direction in FIG. 3C. For this reason, a larger amount of the silicon-containing film tends to be deposited on a top part than on a bottom part of the side wall 180 of the ACL film 160. Accordingly, the second step of the present embodiment is an effective process to correct a "bowing" shape, and makes it possible to form an opening with an excellent vertical shape. Also, the second step can maintain the critical dimension (CD) of the bottom part. Further, because the amount of the silicon-containing film deposited on the bottom part is smaller than the amount of the silicon-containing film deposited on the SiON film 165, it is possible to increase the amount of remaining mask and to form an opening with a high aspect ratio.

Figure 3E:
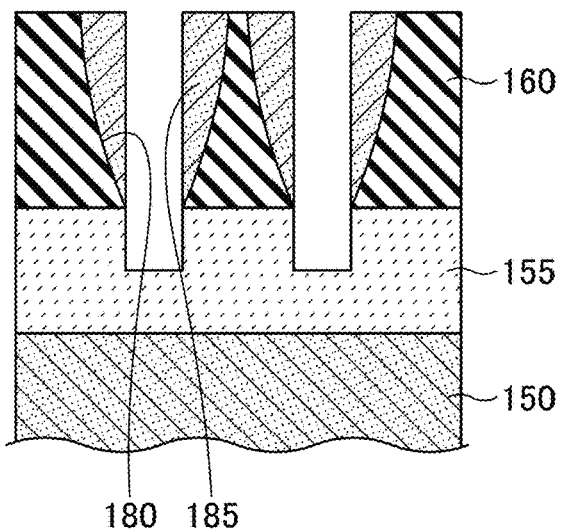
FIG. 3E is a drawing used to describe an exemplary plasma etching method of an embodiment.

Next, as illustrated by FIG. 3D, the oxide film 155 is etched using a film structure including the silicon-containing film 185, the SiON film 165, and the ACL film 160 on the oxide film 155 as a mask. As illustrated by FIG. 3E, because an opening with an excellent vertical shape has been formed as a result of the second step, it is also possible to reduce bowing and form an opening with an excellent vertical shape by etching the oxide film 155.

In the example of FIG. 3C, the second step is performed after etching the ACL film 160 at the first step and thereby exposing the oxide film 155 below the ACL film 160. However, the present invention is not limited to this example. The oxide film 155 may be exposed by gradually etching the ACL film 160 through the repetition of the first step and the second step. In more general terms, the second step may be performed when bowing occurs during the first step to correct a bowing shape of a side wall, and then the first step (and the subsequent second step) may be performed again. In this case, the second step may be performed at any appropriate timing before the width of an opening increases due to bowing in the first step and the width of a partition wall between adjacent openings becomes insufficient. Also, the first step and the second step may be repeated.

Also in the example of FIGS. 3A through 3E, the ACL film 160 is used as an etching-target film, and the second step is performed to correct bowing occurred while etching the ACL film 160. However, the present invention is not limited to this example, and a different film may be used as an etching-target film. For example, even when bowing occurs while etching the oxide film 155 as in FIG. 3E, the second step may be performed to correct the bowing by depositing a silicon-containing mask on at least a part of a side wall of the oxide film 155.

Next, embodiments performed according to the plasma etching method of the present embodiment are described.

First Embodiment

A first embodiment was performed to prove that the plasma etching method of the present embodiment can correct bowing.

A semiconductor wafer W used in the first embodiment includes the silicon substrate 150, and the oxide film 155, the ACL film 160, the SiON film 165, the antireflection film 170 (BARC film 170), and the photoresist film 175 that are stacked beforehand on a surface of the silicon substrate 150 in this order. Also, before performing the plasma etching method of the present embodiment, the photoresist film 175 was patterned to have a predetermined pattern, and the antireflection film 170 and the SiON film 165 were etched (or patterned) using the photoresist film 175 as a mask.

A plasma etching step as the first step and a silicon-containing film deposition step as the second step were performed on the semiconductor wafer W prepared as described above.

The first step and the second step were performed under process conditions indicated below.
(Process Conditions of First Step)
    Pressure: 10 mT (1.33 Pa)
    Power: first high-frequency power/1000 W
    Potential of upper electrode: 0 V
    Gas flow rate: $O_2$ gas/COS gas 200/17 sccm
    Etching time: 120 sec.
(Process Conditions of Second Step)
    Pressure: 300 mT (40 Pa)
    Power: first high-frequency power/250 W, second high-frequency power/300 W
    Gas flow rate: $SiCl_4$ gas/He gas/$H_2$ gas 50/600/150 sccm
    Deposition time: 60 sec.

Figure 4A:
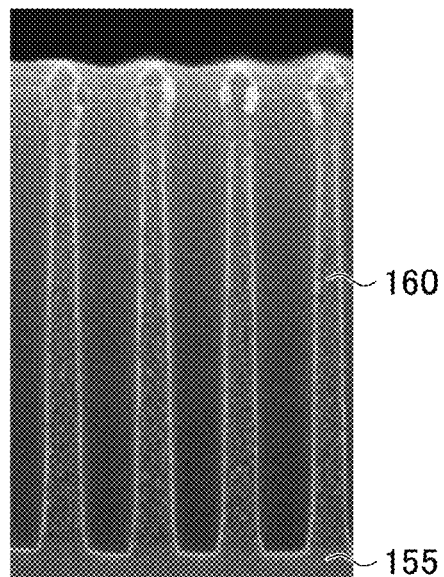
FIG. 4A is a SEM image used to describe an exemplary effect of a plasma etching method of an embodiment.
Figure 4B:
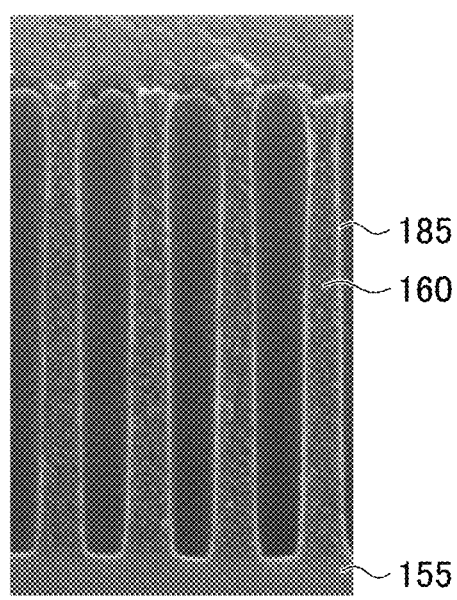
FIG. 4B is a SEM image used to describe an exemplary effect of a plasma etching method of an embodiment.

FIGS. 4A and 4B are SEM images used to describe an exemplary effect of the plasma etching method of the present embodiment. More specifically, FIG. 4A is a SEM image captured after the first step and before the second step, and FIG. 4B is a SEM image captured after the second step.

As is apparent from the comparison of the SEM images of FIGS. 4A and 4B, an opening (hole) with an excellent vertical shape can be obtained by performing the second step.

Also, for the semiconductor wafer W of each of FIGS. 4A and 4B, a "bowing CD" and a "bottom CD" were obtained. In the present application, the "bowing CD" is defined as the largest width between adjacent patterns of the ACL film 160, and the "bottom CD" is defined as the width of the lower end of an opening.

In FIG. 4A, the "bowing CD" was 130 nm, and the "bottom CD" was 86 nm. In FIG. 4B, the "bowing CD" was 110 nm, and the "bottom CD" was 76 nm. These results indicate that the second step can correct bowing. These results also indicate that a silicon-containing film is more likely to be deposited on a part having a bowing shape and the bottom CD can be maintained.

Variation of First Embodiment

As a variation of the first embodiment, the oxide film 155 was also etched using the ACL film 160 as a mask.

A semiconductor wafer W used in this variation includes the silicon substrate 150, and the oxide film 155, the ACL film 160, the SiON film 165, the antireflection film 170 (BARC film 170), and the photoresist film 175 that are stacked beforehand on a surface of the silicon substrate 150 in this order. Also, before performing the plasma etching method of the present embodiment, the photoresist film 175 was patterned to have a predetermined pattern, and the antireflection film 170 and the SiON film 165 were patterned using the photoresist film 175 as a mask.

A plasma etching step as the first step and a silicon-containing film deposition step as the second step were performed on the semiconductor wafer W prepared as described above.

The first step and the second step were performed under process conditions indicated below.
(Process Conditions of First Step)
    Pressure: 10 mT (1.33 Pa)
    Power: first high-frequency power/1000 W
    Potential of upper electrode: 0 V
    Gas flow rate: $O_2$ gas/COS gas 200/17 sccm
    Etching time: 2 min.
(Process Conditions of Second Step)
    Pressure: 300 mT (40 Pa)
    Power: first high-frequency power/250 W, second high-frequency power/300 W
    Gas flow rate: $SiCl_4$ gas/He gas/$H_2$ gas 50/600/150 sccm
    Deposition time: 15 sec.

Plasma etching was performed on the oxide film 155 of the resulting semiconductor wafer W. The plasma etching was performed ender etching conditions indicated below.
    Pressure: 40 mT (5.33 Pa)
    Power: first high-frequency power/1200 W, second high-frequency power/3000 W
    Potential of upper electrode: 300 V
    Gas flow rate: $C_4F_6$ gas/$CF_4$ gas/Ar gas/$O_2$ gas 32/24/600/40 sccm
    Etching time: 150 sec.

Figure 5A:
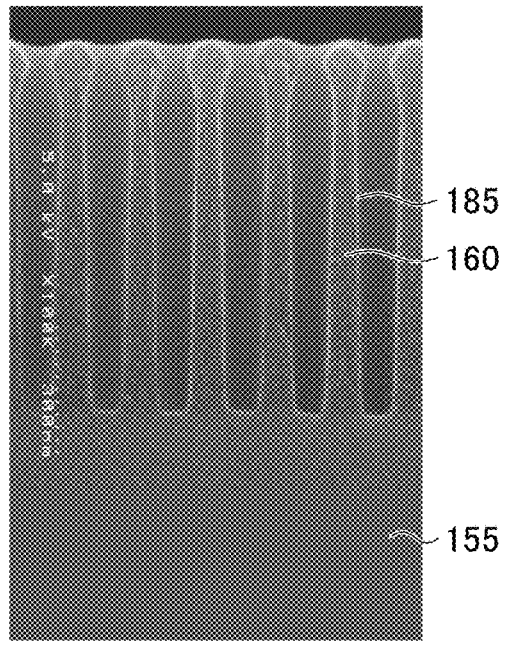
FIG. 5A is a SEM image used to describe another exemplary effect of a plasma etching method of an embodiment.
Figure 5B:
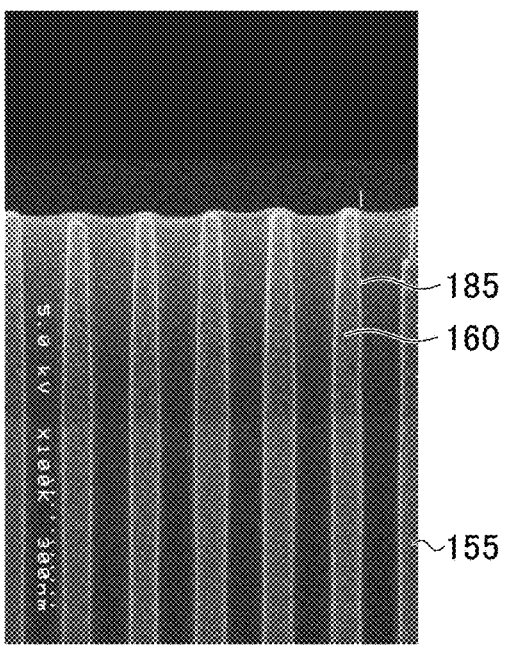
FIG. 5B is a SEM image used to describe another exemplary effect of a plasma etching method of an embodiment.
Figure 5C:
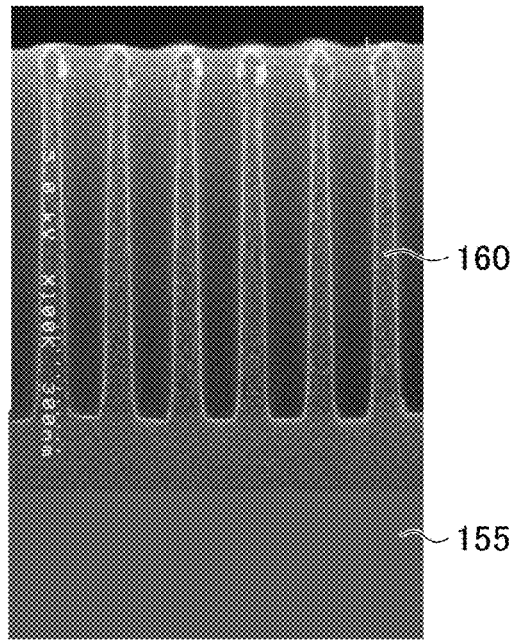
FIG. 5C is a SEM image used to describe another exemplary effect of a plasma etching method of an embodiment.
Figure 5D:
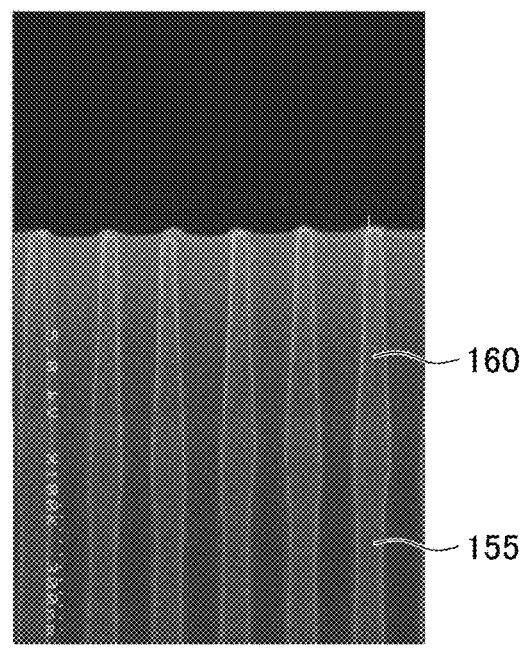
FIG. 5D is a SEM image used to describe another exemplary effect of a plasma etching method of an embodiment.

FIGS. 5A through 5D are SEM images used to describe another exemplary effect of the plasma etching method of the present embodiment. More specifically, FIG. 5A is a SEM image captured after the second step, and FIG. 5B is a SEM image captured after the oxide film 155 of the semiconductor wafer W of FIG. 5A is etched. Also, as comparative examples, FIG. 5C illustrates a SEM image captured immediately after the first step, and FIG. 5D illustrates a SEM image captured after the oxide film 155 is etched without performing the second step.

As is apparent from the comparison of FIGS. 5B and 5D, FIG. 5B of this variation, where the second step was performed, indicates that the present embodiment makes it possible to correct bowing and necking and form a hole with an excellent vertical shape.

In FIG. 5B, the amount of remaining mask is 506 nm, and an opening width (hereafter referred to as a "top CD") at the upper end of the oxide film 155 is 87 nm. In FIG. 5D, the remaining amount of mask is 446 nm, the top CD of the oxide film 155 is 100 nm, and the bowing CD of the oxide film 155 is 100 nm.

Thus, the results of the first embodiment and the variation of the first embodiment indicate that the plasma etching method of the present embodiment makes it possible to reduce necking and bowing, and form a substantially-vertical, fine hole with a high aspect ratio.

Second Embodiment

In a second embodiment, a relationship between the flow rate of a silicon-containing gas and the amount of a deposited silicon-containing film in the second step was confirmed.

A semiconductor wafer W used in the second embodiment includes the silicon substrate 150, and the oxide film 155, the ACL film 160, the SiON film 165, the antireflection film 170 (BARC film 170), and the photoresist film 175 that are stacked beforehand on a surface of the silicon substrate 150 in this order. Also, before performing the plasma etching method of the present embodiment, the photoresist film 175 was patterned to have a predetermined pattern, and the antireflection film 170 and the SiON film 165 were patterned using the photoresist film 175 as a mask.

A plasma etching step as the first step and a silicon-containing film deposition step as the second step were performed on the semiconductor wafer W prepared as described above.

The first step and the second step were performed under process conditions indicated below.
(Process Conditions of First Step)
Pressure: 10 mT (1.33 Pa)
Power: first high-frequency power/1000 W
Potential of upper electrode: 0 V
Gas flow rate: $O_2$ gas/COS gas 200/17 sccm
Etching time: 120 sec.
(Process Conditions of Second Step)
Pressure: 300 mT (40 Pa)
Power: first high-frequency power/250 W, second high-frequency power/300 W
Gas flow rate: $SiCl_4$ gas/He gas/$H_2$ gas variable (10, 30, or 50 sccm)/600/150 sccm
Deposition time: 20 sec.

Figure 6A:
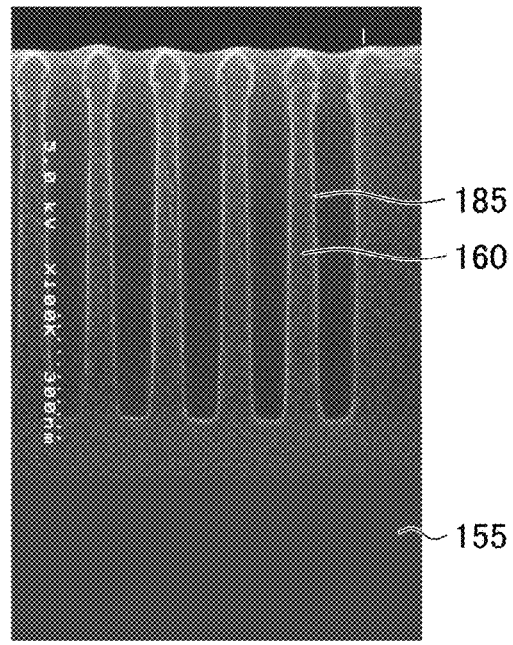
FIG. 6A is a SEM image used to describe another exemplary effect of a plasma etching method of an embodiment.
Figure 6B:
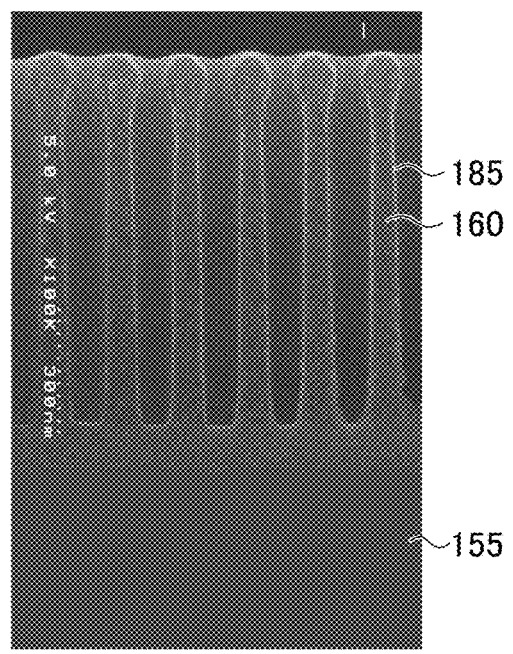
FIG. 6B is a SEM image used to describe another exemplary effect of a plasma etching method of an embodiment.
Figure 6C:
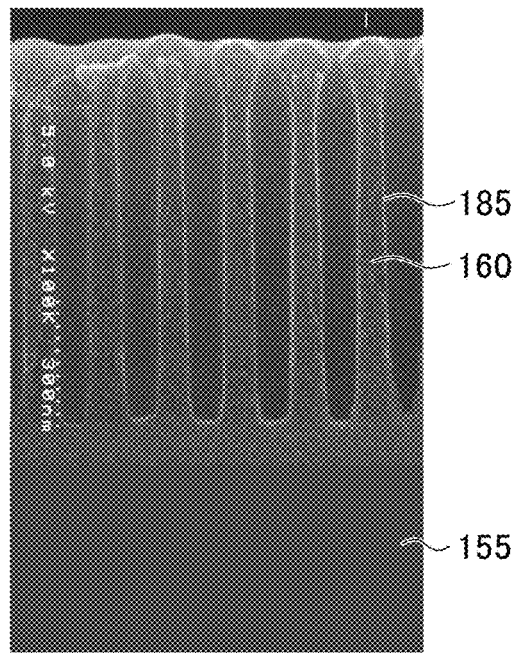
FIG. 6C is a SEM image used to describe another exemplary effect of a plasma etching method of an embodiment.
Figure 6D:
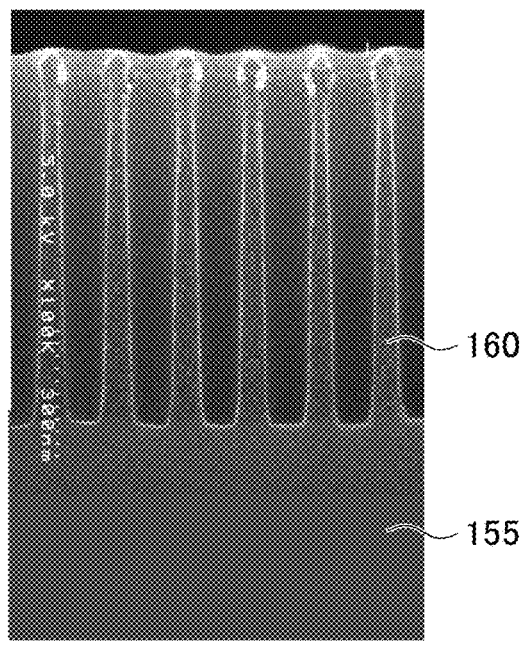
FIG. 6D is a SEM image used to describe another exemplary effect of a plasma etching method of an embodiment.

FIGS. 6A through 6D are SEM images used to describe another exemplary effect of the plasma etching method of the present embodiment. More specifically, FIG. 6A is a SEM image of the present embodiment obtained by setting the flow rate of the $SiCl_4$ gas at 10 sccm in the second step, FIG. 6B is a SEM image of the present embodiment obtained by setting the flow rate of the $SiCl_4$ gas at 30 sccm, and FIG. 6C is a SEM image of the present embodiment obtained by setting the flow rate of the $SiCl_4$ gas at 50 sccm. Also, FIG. 6D is a SEM image of a comparative example where the second step is not performed.

In FIGS. 6A through 6D, the "bowing CD" is 120 nm, 117 nm, 117 nm, and 124 nm, respectively. Also in FIGS. 6A through 6D, the "bottom CD" is 80 nm, 76 nm, 76 nm, and 84 nm, respectively. These results indicate that the deposition rate of the silicon-containing film 185 increases as the flow rate of the silicon-containing gas increases. However, as indicated by FIG. 6C, this also causes the opening to be closed by the silicon-containing film 185 and reduces the deposition rate in the hole.

Thus, the results of the second embodiment indicate that the deposition rate of a silicon-containing film is increased by increasing the flow rate of a silicon-containing gas in the second step of the plasma etching method of the present embodiment.

Third Embodiment

In a third embodiment, the oxide film 155 is selected as an etching target film.

A semiconductor wafer W used in the third embodiment includes the silicon substrate 150, and the oxide film 155, the ACL film 160, the SiON film 165, the antireflection film 170 (BARC film 170), and the photoresist film 175 that are stacked beforehand on a surface of the silicon substrate 150 in this order. Also, before performing the plasma etching method of the present embodiment, the photoresist film 175 was patterned to have a predetermined pattern, and the antireflection film 170 and the SiON film 165 were patterned using the photoresist film 175 as a mask.

Using the semiconductor wafer W prepared as described above, a plasma etching step on the ACL film 160 was performed as the first step and a silicon-containing film deposition step on a side wall of the ACL film 160 was performed as the second step. Further, a plasma etching step on the oxide film 155 was performed as a first' step, and a silicon-containing film deposition step on side walls of the ACL film 160 and the oxide film 155 was performed as a second' step.

The respective steps were performed under process conditions indicated below.
(Process Conditions of First Step)
Pressure: 10 mT (1.33 Pa)
Power: first high-frequency power/1000 W
Potential of upper electrode: 0 V
Gas flow rate: $O_2$ gas/COS gas 200/17 sccm
Etching time: 120 sec.
(Process Conditions of Second Step)
Pressure: 300 mT (40 Pa)
Power: first high-frequency power/250 W, second high-frequency power/300 W
Gas flow rate: $SiCl_4$ gas/He gas/$H_2$ gas 50/600/150 sccm
Deposition time: 15 sec.
(Process Conditions of First' Step)
Pressure: 40 mT (5.33 Pa)
Power: first high-frequency power/1200 W, second high-frequency power/3000 W
Potential of upper electrode: 300 V
Gas flow rate: $C_4F_6$ gas/$CF_4$ gas/Ar gas/$O_2$ gas 32/24/600/40 sccm
Etching time: 160 sec.
(Process Conditions of Second' Step)
Pressure: 300 mT (40 Pa)
Power: first high-frequency power/250 W, second high-frequency power/300 W
Gas flow rate: $SiCl_4$ gas/He gas/$H_2$ gas 50/600/150 sccm
Deposition time: 20 sec.

Plasma etching was performed on the oxide film 155 of the resulting semiconductor wafer W. The plasma etching was performed under etching conditions indicated below.
Pressure: 40 mT (5.33 Pa)
Power: first high-frequency power/1200 W, second high-frequency power/3000 W
Potential of upper electrode: 300 V
Gas flow rate: $C_4F_6$ gas/$CF_4$ gas/Ar gas/$O_2$ gas 32/24/600/40 sccm
Etching time: 50 sec.

Figure 7A:
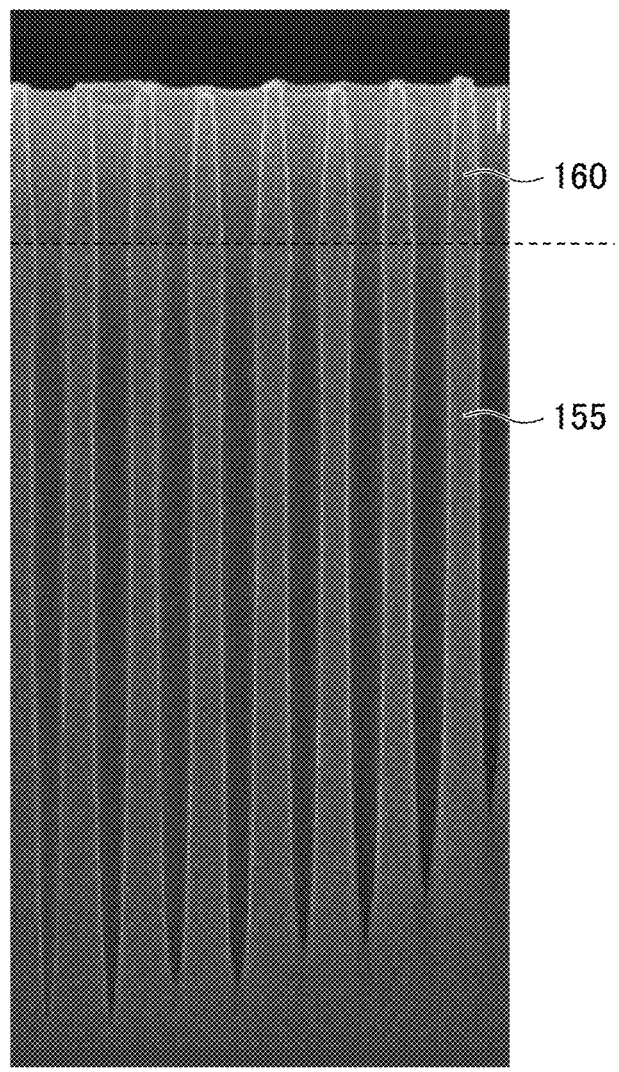
FIG. 7A is a SEM image used to describe another exemplary effect of a plasma etching method of an embodiment.
Figure 7B:
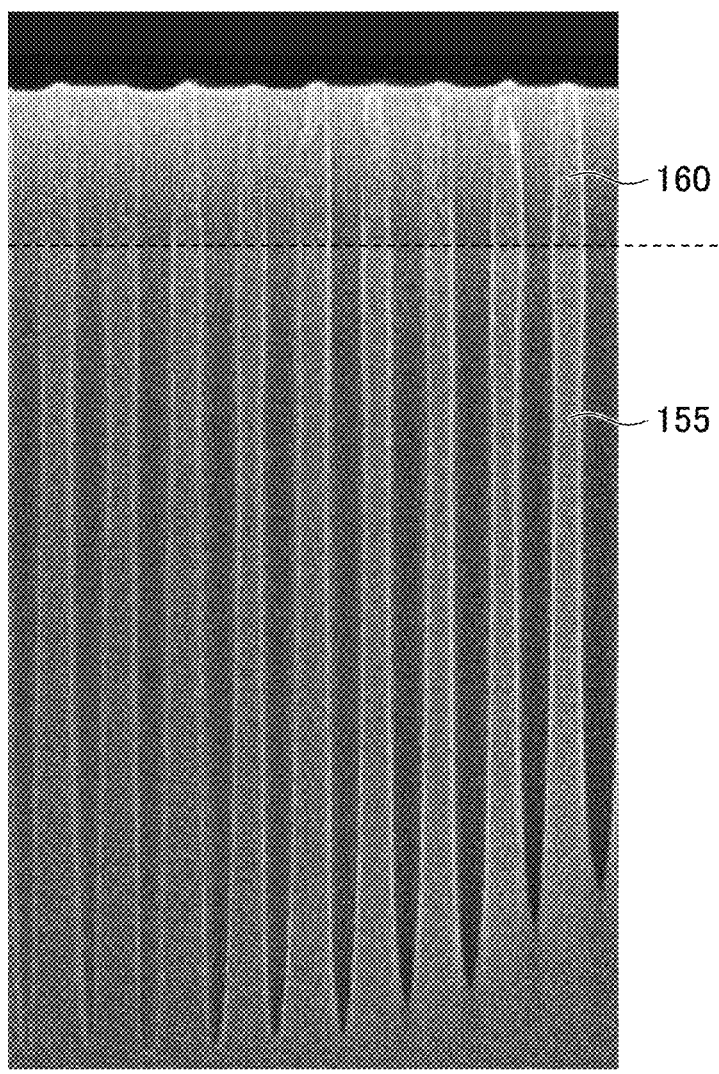
FIG. 7B is a SEM image used to describe another exemplary effect of a plasma etching method of an embodiment.

FIGS. 7A and 7B are SEM images used to describe another exemplary effect of the plasma etching method of the present embodiment. More specifically, FIG. 7A is a SEM image captured after performing the plasma etching on the oxide film 155 after the second' step, and FIG. 7B is a SEM image of a comparative example where the second' step was not performed.

In FIG. 7A, the largest width between adjacent patterns is 97 nm, and the amount of remaining mask is 414 nm. In FIG. 7B, the largest width between adjacent patterns is 107 nm, and the amount of remaining mask is 410 nm.

Thus, the results of the third embodiment indicate that even when a film other than the ACL film is etched as an etching target film, a bowing shape can be corrected by depositing a silicon-containing film on a side wall of an opening by the second step.

Fourth Embodiment

In a fourth embodiment, the first step and the second step were performed multiple times on one etching target film.

Using the semiconductor wafer W obtained in the third embodiment, a plasma etching step on the oxide film 155 was performed as a first" step (which corresponds to a third step in the claims), and a silicon-containing film deposition step on side walls of the ACL film 160 and the oxide film 155 was performed as a second" step (which corresponds to a fourth step in the claims).

The respective steps were performed under process conditions indicated below.
(Process Conditions of First" Step)
Plasma etching was performed on the oxide film 155 of the resulting semiconductor wafer W under the following etching conditions.
  Pressure: 40 mT (5.33 Pa)
  Power: first high-frequency power/1200 W, second high-frequency power/3000 W
  Potential of upper electrode: 300 V
  Gas flow rate: $C_4F_6$ gas/$CF_4$ gas/Ar gas/$O_2$ gas 32/24/600/40 sccm
  Etching time: 50 sec.
(Process Conditions of Second' Step)
  Pressure: 300 mT (40 Pa)
  Power: first high-frequency power/250 W, second high-frequency power/300 W
  Gas flow rate: $SiCl_4$ gas/He gas/$H_2$ gas variable (10, 30, or 50 sccm)/600/150 sccm
  Deposition time: 20 sec.

Also, plasma etching was performed on the oxide film 155 of the semiconductor wafer W after the second" step. The plasma etching was performed under etching conditions indicated below.
  Pressure: 40 mT (5.33 Pa)
  Power: first high-frequency power/1200 W, second high-frequency power/3000 W
  Potential of upper electrode: 300 V
  Gas flow rate: $C_4F_6$ gas/$CF_4$ gas/Ar gas/$O_2$ gas 32/24/600/40 sccm
  Etching time: 50 sec.

Figure 8A:
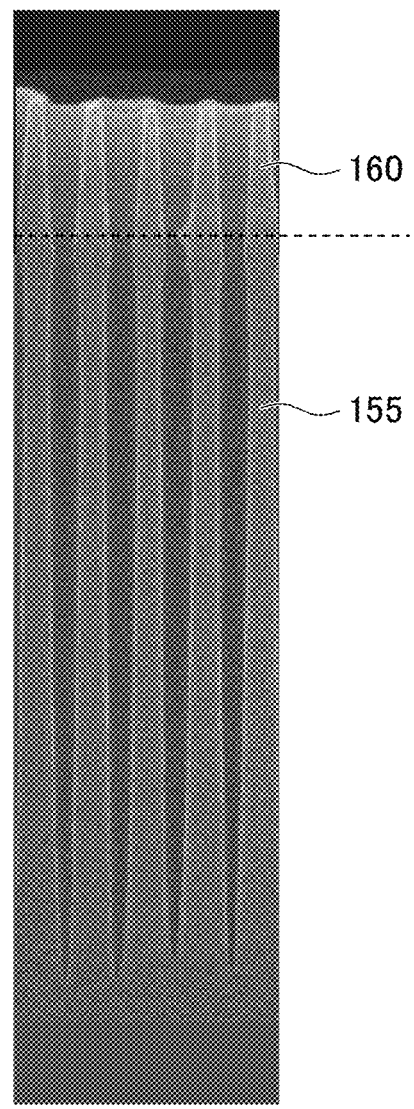
FIG. 8A is a SEM image used to describe another exemplary effect of a plasma etching method of an embodiment.
Figure 8B:
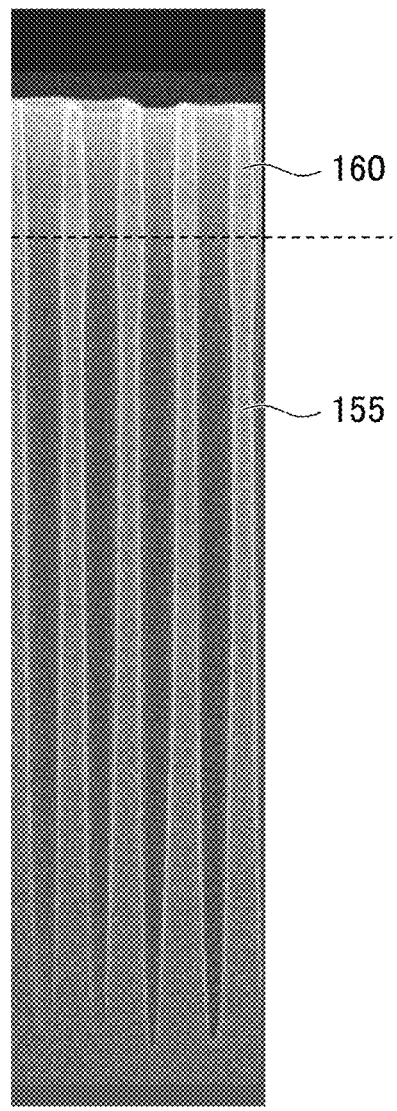
FIG. 8B is a SEM image used to describe another exemplary effect of a plasma etching method of an embodiment.

FIGS. 8A and 8B are SEM images used to describe another exemplary effect of the plasma etching method of the present embodiment. More specifically, FIG. 8A is a SEM image captured after performing the plasma etching on the oxide film 155 after the second" step, and FIG. 7B is a SEM image of a comparative example where the second" step was not performed.

In FIG. 8A, the largest width between adjacent patterns is 103 nm. In FIG. 8B, the largest width between adjacent patterns is 117 nm.

Thus, the results of the fourth embodiment indicate that plasma etching can be gradually performed while correcting a bowing shape, by repeating the first step and the second step.

The present invention is not limited to the embodiments described above, and variations and modifications may be made depending on applications without departing from the scope of the present invention.

EXPLANATION OF REFERENCE NUMERALS

1 Plasma etching apparatus
10 Chamber
15 Gas supply
20 Lower electrode
25 Upper electrode
30 Power supply device
32 First high-frequency power supply
33 First matching box
34 Second high-frequency power supply
35 Second matching box
40 Shield ring
45 Gas inlet
50 Diffusion chamber 50
55 Gas supply hole
60 Evacuation port
65 Evacuation device
100 Controller
105 CPU
110 RAM
150 Silicon substrate
155 Oxide film
160 ACL film
165 SiON film
170 Antireflection film
175 Photoresist film
180 Side wall
185 Silicon-containing film
G Gate valve
W Wafer

The invention claimed is:
1. A plasma processing apparatus comprising:
a process chamber having at least one gas inlet;
a holder disposed in the process chamber;
an electrode plate disposed above the holder;
a first radio-frequency power supply configured to supply a first radio-frequency power to the holder or the electrode plate;
a second radio-frequency power supply configured to supply a second radio-frequency power to the holder; and
a controller configured to cause:
  (a) placing an object on the holder, the object including a first layer, a mask on the first layer, and a second layer under the first layer, the second layer including a silicon oxide material;
  (b) etching the first layer through the mask to form a first opening in the first layer, the first opening being defined by at least a first side wall, the first side wall including a bow-shaped portion;
  (c) depositing a first film on at least the bow-shaped portion; and
  (d) etching the second layer through the etched first layer after (c).

2. The plasma processing apparatus according to claim 1, wherein the controller is configured to cause:
(e) repeating (b) and (c).

3. The plasma processing apparatus according to claim 1, wherein the first film is deposited by plasma chemical vapor deposition.

4. The plasma processing apparatus according to claim 1, wherein the first layer is etched such that a width of the first opening in the first layer is greater than a width of an opening of the mask.

5. The plasma processing apparatus according to claim 1, wherein the controller is configured to cause:
(f) depositing a second film on a second side wall defining a second opening formed in the etched second layer.

6. The plasma processing apparatus according to claim 1, wherein the first film includes a silicon-containing material.

7. A plasma processing apparatus comprising:
a process chamber having at least one gas inlet;
a holder disposed in the process chamber;
an electrode plate disposed above the holder;
a radio-frequency power supply configured to supply a radio-frequency power to the holder or the electrode plate; and
a controller configured to cause:
(a) placing an object on the holder, the object including a first layer, and a second layer under the first layer, the second layer including a silicon oxide material;
(b) etching the first layer to form an etched feature in the first layer, the etched feature having a first side wall, the first side wall including a bowed surface;
(c) depositing a first film on the bowed surface; and
(d) etching the second layer through the etched first layer after (c).

8. The plasma processing apparatus according to claim 7, wherein the controller is configured to cause:
(e) repeating (b) and (c).

9. The plasma processing apparatus according to claim 7, wherein the first film is deposited by plasma chemical vapor deposition.

10. The plasma processing apparatus according to claim 7, wherein the controller is configured to cause:
(f) depositing a second film on a second side wall defining a second opening formed in the etched second layer.

11. The plasma processing apparatus according to claim 7, wherein the first film includes a silicon-containing material.

12. A plasma processing apparatus comprising:
a process chamber having at least one gas inlet;
a holder disposed in the process chamber;
a plasma generator configured to generate a plasma from a process gas in the process chamber; and
a controller configured to cause:
(a) placing an object on the holder, the object including a first layer, a mask on the first layer, and a second layer under the first layer, the second layer including a silicon oxide material;
(b) providing a first etching phase, comprising:
(b1) etching the first layer through the mask to form a first opening in the first layer, the first opening being defined by a first side wall, the first side wall including a bow-shaped portion;
(b2) depositing a first film on the bow-shaped portion; and
(b3) repeating (b1) and (b2); and
(c) providing a second etching phase, comprising:
(c1) etching the second layer through the etched first layer.

* * * * *